United States Patent
Ward et al.

(10) Patent No.: US 6,832,172 B2
(45) Date of Patent: Dec. 14, 2004

(54) APPARATUS AND METHOD FOR SPECTRUM ANALYSIS-BASED SERIAL DATA JITTER MEASUREMENT

(75) Inventors: Benjamin A. Ward, Portland, OR (US); Kan Tan, Beaverton, OR (US); Mark L. Guenther, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 169 days.

(21) Appl. No.: 10/150,558

(22) Filed: May 16, 2002

(65) Prior Publication Data

US 2003/0004664 A1 Jan. 2, 2003

Related U.S. Application Data

(60) Provisional application No. 60/298,582, filed on Jun. 15, 2001.

(51) Int. Cl.[7] ............................................. G01R 13/00
(52) U.S. Cl. ....................................................... 702/69
(58) Field of Search ........................... 702/69, 77, 190, 702/191, 195; 375/130, 226, 371

(56) References Cited

U.S. PATENT DOCUMENTS

6,356,850 B1     3/2002  Wilstrup
2001/0044704 A1 * 11/2001 Li et al. ...................... 702/180

FOREIGN PATENT DOCUMENTS

WO        WO 99 39216 A    8/1999

OTHER PUBLICATIONS

Mike P. Li, et al., "A New Method for Jitter Decomposition Through Its Distribution Tail Fitting", ITC International Test Conference, Wavecrest Corporation, pp. 788–794, Issue No. 0–7803–6753–1/99, Copyright 1999 IEEE.

Li, et al. "A New Method for Jitter Decomposition Through It's Distribution Tail Fitting":, Proceedings International Test Conference 1999, ITC 99, Atlantic City, N.J., Sep. 28–30, 1999. International Test Conference, New York, NY. IEEE, US, vol. Conf. 30, Sep. 28, 1999, pp. 788–794, XP002140775. ISBN: 0–7803–5754–X.

Farhang–Boroujeny B. et al., "Nyquist Filters With Robust Performance Against Timing Jitter", IEEE Transactions on Signal Processing, Dec. 1998, IEEE, USA vol. 46, No. 12, pp. 3427–3431, XP002244699. ISBN: 1053–587X.

Pereira, Jorge M. N. et al, "Inherent–Jitter Effects In The New Rapid Acquisition Method For Frequency –Hopped Push–To–Talk Spread Spectrum Systems: A Jitter–Fighting Scheme,", Effects of Electromagnetic Noise and Interference on Performance of Military Radio Communication Systems (AGARD–CP–4230), Lisbon, Portugal, Oct. 26–30, 1987, pp. 23/1–20, XP008016467 1988, Neuilly Sur Seine, France, AGARD, France.

* cited by examiner

*Primary Examiner*—Michael Nghiem
(74) *Attorney, Agent, or Firm*—Thomas F. Lenihan; Francis I. Gray

(57) ABSTRACT

A jitter separation apparatus and method, based on spectrum analysis, separates deterministic jitter and random jitter using their spectral properties. Deterministic jitter is periodic and nature and exhibits a spectrum of impulses, whereas random jitter exhibits a broad, flat spectrum. A time domain histogram and a frequency domain histogram of the signal are investigated to obtain jitter components.

13 Claims, 11 Drawing Sheets

APPARATUS AND METHOD FOR SPECTRUM ANALYSIS-BASED SERIAL DATA JITTER MEASUREMENT

CLAIM FOR PRIORITY

The subject application claims priority from U.S. Provisional Patent Application Ser. No. 60/298,582 entitled Serial Data Jitter Analysis: Decomposing Jitter Using A Spectrum Approach, (Ward, et al.) filed Jun. 15, 2001, and assigned to the same assignee as the subject application.

FIELD OF THE INVENTION OF THE INVENTION

The subject invention generally concerns the field of jitter measurement, and in particular concerns an apparatus and method for measuring jitter in a signal under test with a real time digital storage oscilloscope.

BACKGROUND OF THE INVENTION

Jitter is a well-known term of art used to define the deviation from an ideal timing of an event in a signal. Jitter results in the mispositioning of the significant edges in a sequence of data bits from their ideal positions. In modern serial data communications systems, the serial data clock is not usually transmitted with the data, so jitter could cause data errors at the receiving end. It is therefore extremely important to determine the amount and kind of jitter that may be present in a signal under test. In this regard, it is noted that jitter comprises two distinct types, deterministic jitter (DJ) and random jitter (RJ). Random jitter (RJ) is unbounded in amplitude and assumed to be Gaussian. In contrast, deterministic jitter is not random and is bounded in amplitude, and comprises Intersymbol Interference (ISI), Duty Cycle Distortion (DCD), and Periodic Jitter (PJ). Note that Intersymbol Interference (ISI) is also known in the art as Data Dependent Jitter (DDJ).

ISI is data-dependent deterministic jitter caused by the time differences required for a signal to arrive at a receiver threshold when starting from different places in bit sequences (i.e., symbols). DCD is the difference in the mean pulse width of a logic "1" pulse compared to the mean pulse width of a logic "0" pulse in a clock-like bit sequence. PJ is characterized by periodic variations in edge transition times at frequencies that are uncorrelated with the data rate. The signed difference between the measured time location of each sequential data symbol transition and the nominal symbol transition time is called the Time Interval Error (TIE).

RJ and DJ accumulate differently in a serial data communication link. If the parameters that characterize each of the two categories of jitter are available, then bit error rate (BER) can be estimated. It is therefore desirable to be able to measure each of the two categories of jitter. Unfortunately, one cannot simply choose to measure one of the two categories of jitter because both categories are always mixed together and appear as "total jitter". One must separate the two categories prior to estimating their parameters.

U.S. Pat. No. 6,356,850 B1(Wistrup, et al.) discloses a jitter separation and parameter estimation apparatus and method which is based on a Time Interval Analyzer (TIA) using an arming system. Unfortunately, a TIA with an arming system does not lend itself to incorporation in an oscilloscope without that arming system. Thus, existing oscilloscopes are capable of showing only total jitter. What is needed is a solution to the problem of measuring RJ and DJ with an oscilloscope.

SUMMARY OF THE INVENTION

A jitter separation apparatus and method, based on spectrum analysis, separates deterministic jitter and random jitter using their spectral properties. Deterministic jitter exhibits a spectrum of impulses, whereas random jitter exhibits a broad, flat spectrum. A time domain histogram and a frequency domain histogram of the signal are investigated to obtain jitter components. Bit error rate estimation is performed based on the jitter separation result.

DETAILED DESCRIPTION OF THE EMBODIMENTS

In a typical jitter measurement sequence, a waveform is acquired and stored in the memory of a digital storage oscilloscope. Total jitter can be measured from the waveform. The most likely jitter measurement to be evaluated is clock or data time interval error (TIE), so the first processing step is the measurement of TIE. Next it is desirable to separate DJ from RJ, and if possible, to decompose the DJ into its components of ISI, DCD and PJ. Once the individual DJ and RJ components are known, a so-called "bathtub curve" can be derived. From the bathtub curve, the bit error rate that would correspond to a given eye opening can be directly read. This series of steps is described graphically in FIG. 1.

Figure 1:
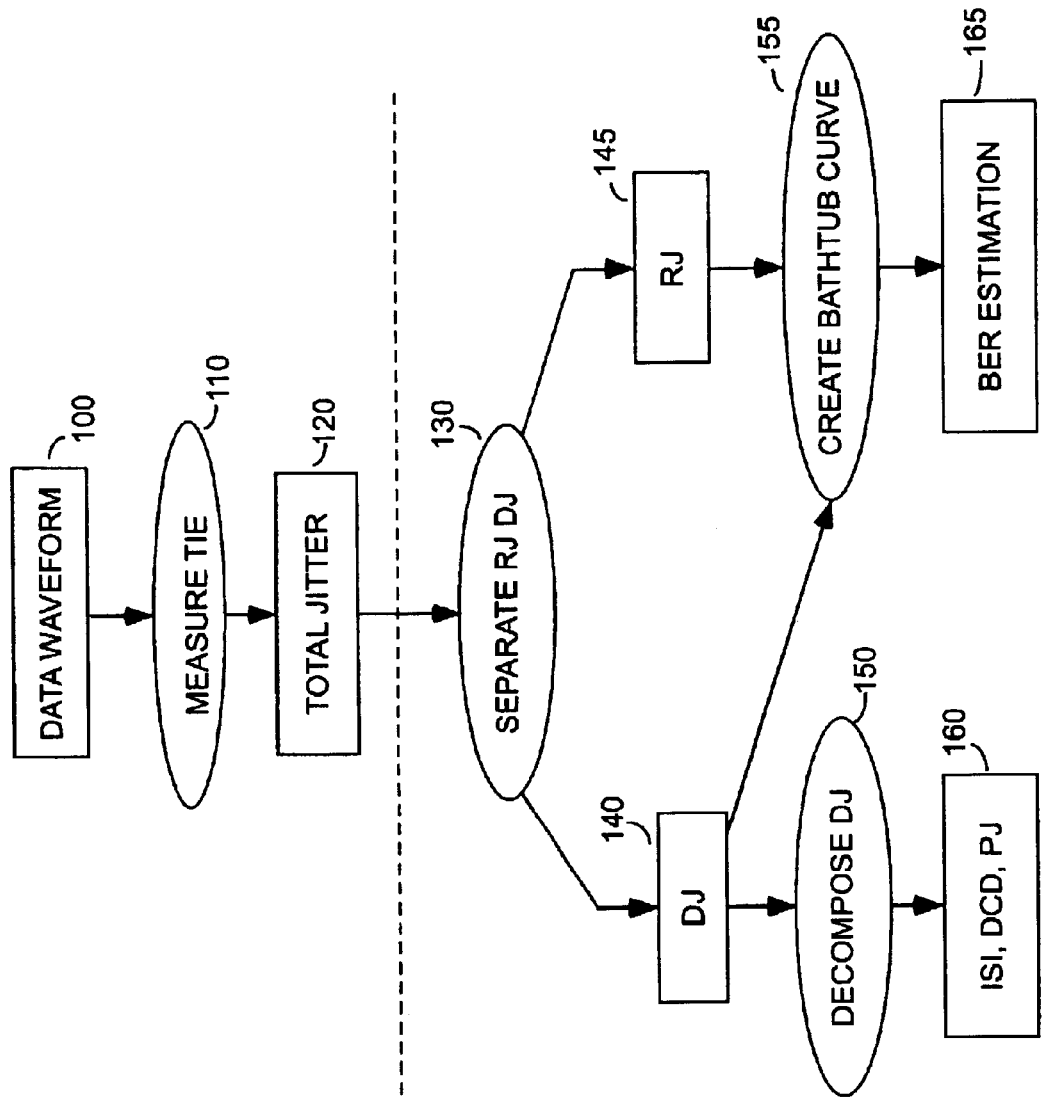
FIG. 1 is a graphical description of an embodiment of the subject invention.

In FIG. 1, those elements 100, 110, 120 above the dashed line, are known from the prior art; those elements 130, 140, 145, 150, 155, 160, 165 appearing below the dashed line are elements of the subject invention.

The measurement of TIE and the estimation of BER from the RJ and DJ components are known from the prior art. A brief description of these matters is given below as an aid in understanding the invention. The novel methods by which separation of total jitter in to RJ and DJ, and by which DJ may be further decomposed, will be described in detail below.

The measurement of data time interval error (TIE) involves comparison of corresponding edge time locations in a sampled data waveform and a calculated ideal data waveform having no jitter. TIE consists of calculating the difference in time between a threshold crossing of each corresponding symbol transition (or bit transition) edge in the two waveforms. This procedure is described in FIG. 2, and may be summarized as follows.

Given a measured waveform (step 200), a hardware or software symbol transition edge finder precisely locates data edges (step 210). The data edges are assigned to corresponding data symbols (step 220). Ideal data edge locations are calculated (step 230), and then subtracted (step 240) on a edge-by-edge basis from the measured locations to form the data TIE (step 250). Where there is no edge between two or more symbols because the symbols have the same level, TIE for the group of symbols can be estimated by interpolation (step 260) to form an interpolated data TIE time train (step 270).

Figure 3:
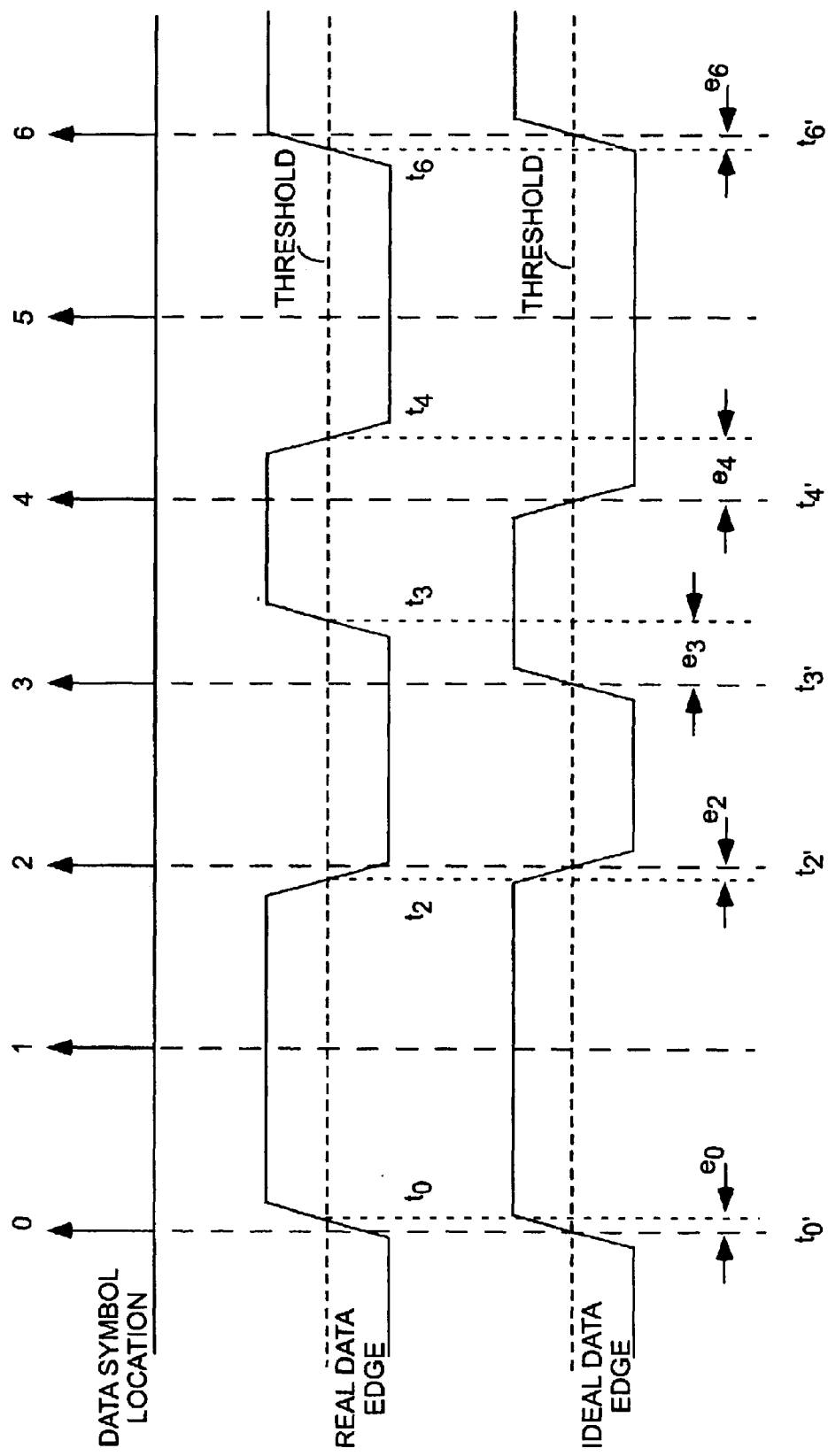
FIG. 3 shows waveforms useful in understanding the procedure of FIG. 2

The waveforms of FIG. 3 illustrate this approach. In this example, after the waveform is acquired, the edge finder identifies the real data edges and assigns them to data symbol transition locations. The real data edge locations are recorded as $t_0, t_2, t_3, t_4, t_5 \ldots$ The next step is to calculate the ideal data edge locations. This may be done through linear fitting, PLL-based recovery of the data clock, or other approaches. The (signed) differences between real data edge locations and ideal data edge locations are the data TIE:

$$e_i = t_i - t_i', \text{ for } i=0, 2, 3, 4, 6$$

Notice that there are no transitions at certain data symbol locations, such as symbol locations 1 and 5. The TIE at these missing transitions locations need not to be considered if only the bit error is of concern, since they don't contribute to bit error. However, they are of great interest if the spectrum of TIE is considered. Their values can be obtained by interpolation from the TIE at their neighbor locations. For example, TIE $e_1$ and $e_5$ can be interpolated from $e_0, e_2, e_3, e_4, e_6 \ldots$ The TIE at interpolated locations are marked "interpolated" so that they can be distinguished from those TIE corresponding to transitions.

Figure 4:
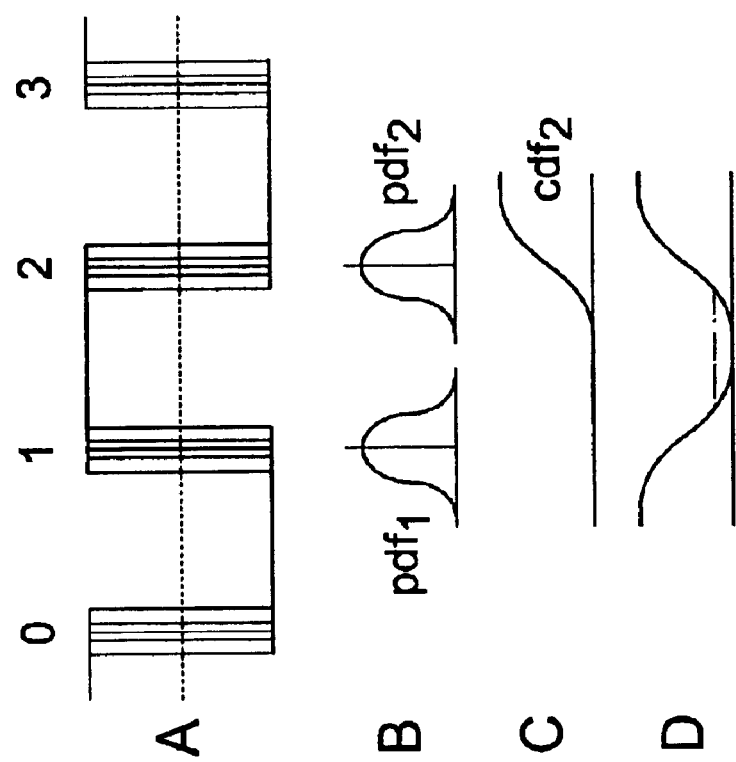
FIG. 4 shows one waveform and three graphs useful in understanding the subject invention.

Once a complete statistical description of the jitter has been measured, the corresponding Probability Distribution Function (PDF) of the total jitter can be derived (or estimated). This, in turn, allows a bathtub curve to be created. The bathtub curve directly shows how much timing margin is available for a given bit error rate. Referring to FIG. 4, the process of creating a bathtub curve is described as follows.

Waveform A of FIG. 4 shows a representative segment of data for which the edges have jitter, as indicated by the multiple lines on each transition. In particular, this segment of data happens to have transitions at times 1 and 2, which are one symbol-width (or unit interval) apart.

Each data transition is subject to jitter (TJ), which has been characterized by its PDF. The left portion of the graph B of FIG. 4 shows this PDF as it applies to transitions 1. Similarly, the right portion of graph B of FIG. 4 shows this PDF as it applies to transition 2.

Graph C of FIG. 4 shows the cumulative distribution function (or CDF) for transition 2. For any given horizontal position $t_O$, this CDF gives the probability that transition 2 will occur prior to horizontal position $t_O$. For transition 1, we are interested in the probability that transition 1 will occur subsequent to a given point, so we must use the complementary CDF instead. Graph D of FIG. 4 shows the CDF for transition 1 and the CDF for transition +2 superimposed. The decision error rate will be lower than certain bit error rate specified as long as the decision time is chosen somewhere "in the bathtub", as indicated by the short horizontal line. This line can be positioned at a vertical level that corresponds to a chosen bit error rate, and the corresponding time interval (usually expressed in unit intervals and called "eye opening") can be directly observed. Note that the bathtub curve is conventionally drawn using logarithmic scaling on the vertical axis, since the BERs of interest correspond to levels very near to zero.

The subject invention, a jitter separation method based on spectrum analysis, will be described with respect to FIGS. 5 through 11. In this approach, it is assumed that the serial data signal being measured consists of a periodically repeating pattern. The other assumption on the measured signal is that the length of the repeating pattern is known. (When the length of the repeating pattern is not known, it is quite often easily determined by examination of the spectrum of the signal.).

Figure 2:
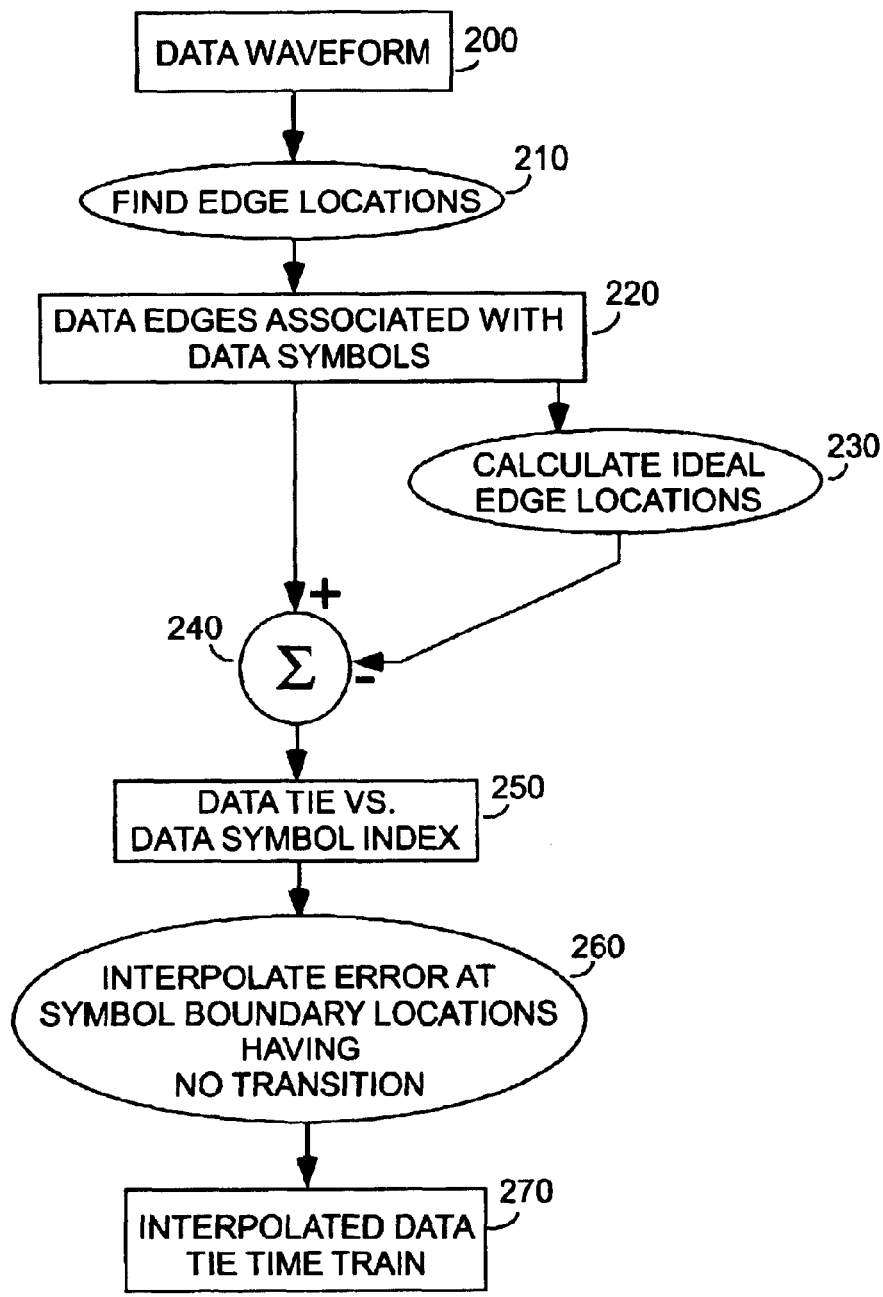
FIG. 2 is an illustration of a procedure for measuring data time interval error (TIE)
Figure 5:
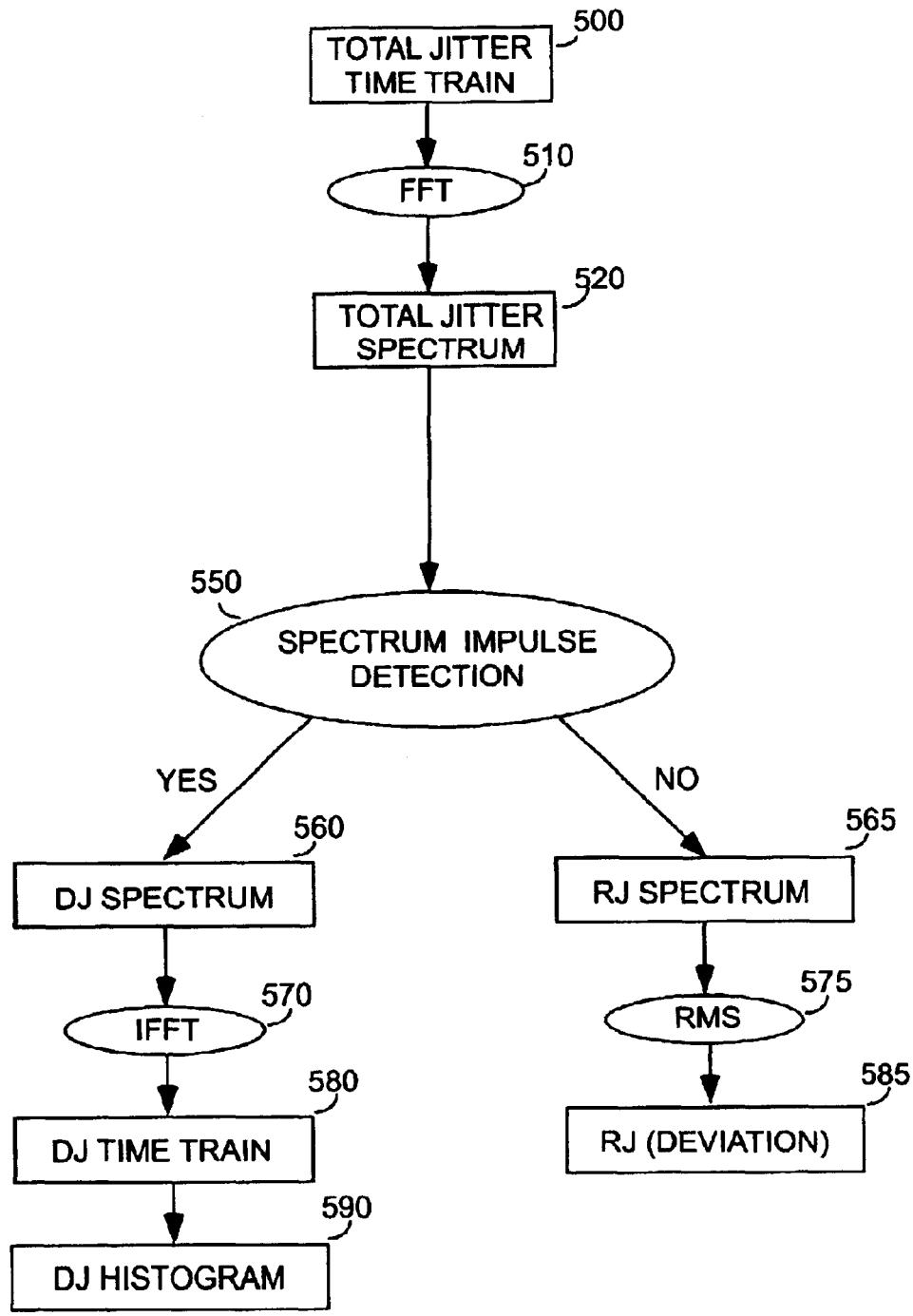
FIG. 5 is a flowchart showing DJ/RJ separation in accordance with the subject invention.

The interpolated TIE time train obtained as described in FIG. 2 is considered to be the total jitter to be analyzed. As noted earlier, this total jitter has two generalized categories of jitter: DJ and RJ. A spectrum approach is disclosed and employed herein to separate DJ and RJ, as shown in FIG. 5.

The spectrum approach separates DJ and RJ based upon the following observations:

1. RJ is assumed to be Gaussian; its spectrum is broad and distributed over all frequencies.
2. DJ is periodic in the time domain and it has a spectrum of impulses in the frequency domain, since the serial data signal consists of a periodically repeating data pattern.

Note that a window function is applied before doing an FFT to obtain the spectrum. This window function may be, for example, a Blackman windowing function, or other appropriate windowing function.

Figure 6:
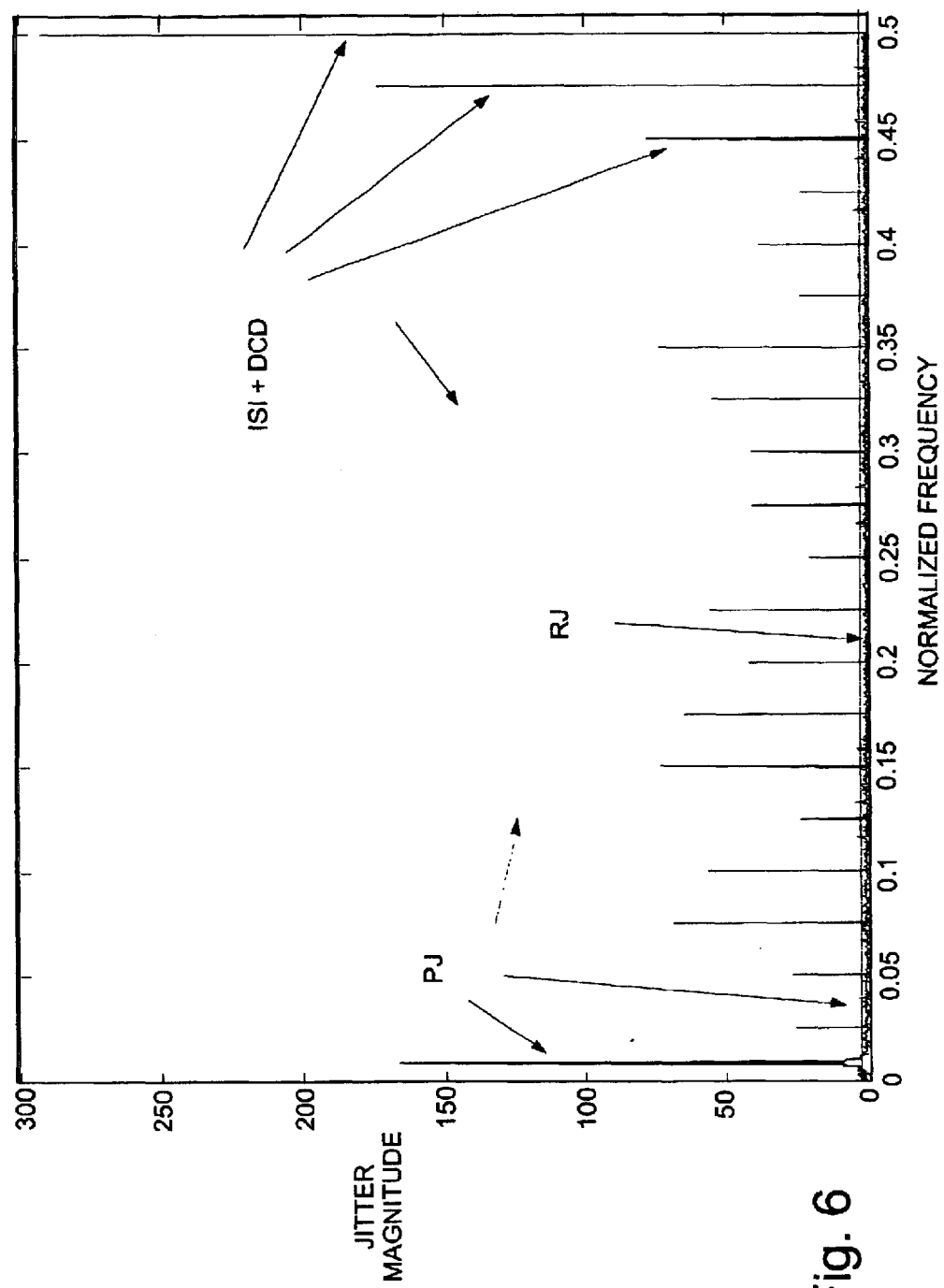
FIG. 6 illustrates the different properties of DJ and RJ in the spectrum of total jitter (TJ).
Figure 7:
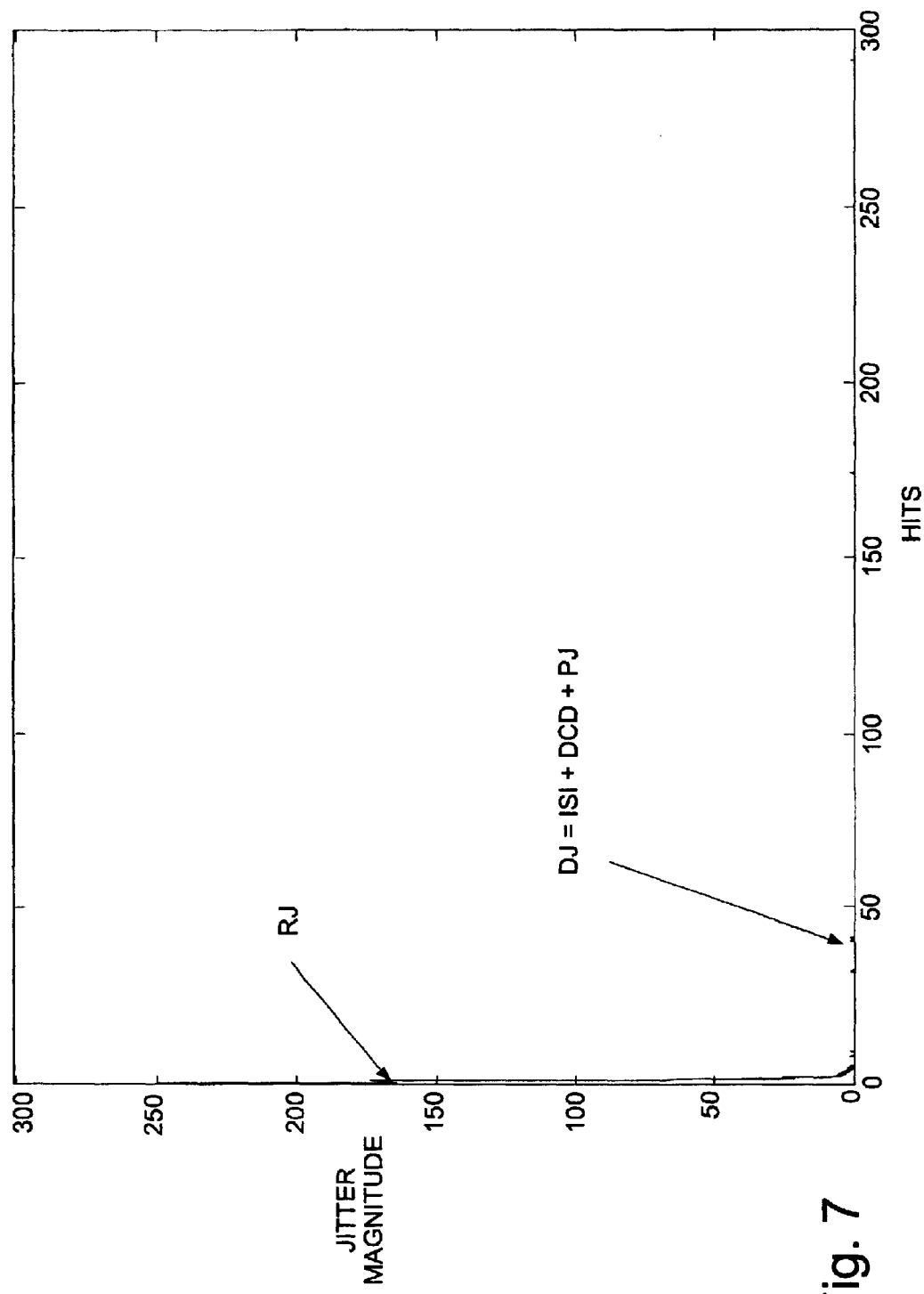
FIG. 7 shows the spectrums of DJ and RJ.

As FIG. 6 (showing a TIE Spectrum) illustrates, the different properties of DJ and RJ are readily observable in the spectrum of total jitter (TJ). Various approaches can be taken to separate the impulses from the "noise floor". One of these is a histogram approach (steps 500, 510, 520, 550). If the "noise floor" of the RJ is flat, its level shows up clearly in the histogram of the spectrum, since a large number of FFT bins appear at this amplitude and below. Because the number of impulses is proportionately small, these show up at relatively low levels in the histogram. This histogram approach can be applied with a sliding window to detect impulses locally. The sliding window moves across the whole spectrum span. The spectrums of DJ and RJ are shown in the Histogram of Spectral Magnitude of FIG. 7.

Referring again to FIG. 5, the standard deviation parameter of the RJ component can be obtained by computing the RMS value of the RJ derived from the frequency domain histogram (steps 565, 575, 585). Note that the effect of window function can be directly taken into account. The DJ-only spectrum can be recovered by setting to zero all those bins from the TJ spectrum that are attributable to RJ (step 560). A time-domain record of the DJ can be obtained by performing an inverse FFT on this DJ spectrum (step 570). Note that after inverse FFT, the effect of window function should be reversed. The peak-to-peak time value, which is the parameter of interest for DJ, can then be found directly from this time-domain waveform (steps 580, 590). Note that those locations marked as "interpolated" are not counted when determining the peak-peak value.

Figure 8:
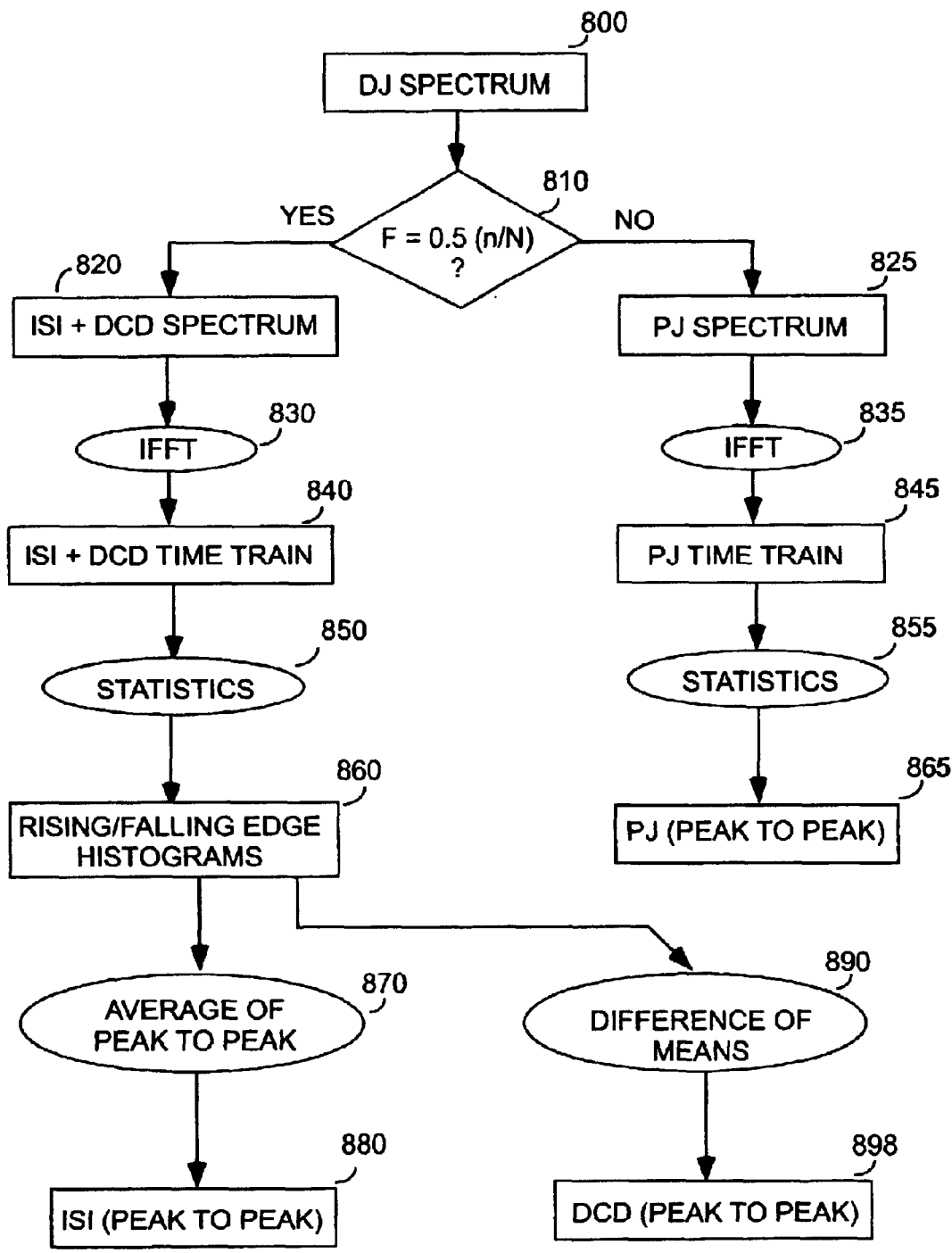
FIG. 8 is a flowchart showing ISI, DCD, and PJ separation in accordance with the subject invention.

The spectrum of DJ, which consists solely of impulses, was obtained in the previous steps. Referring to FIG. 8, DJ has three components: ISI, DCD and PJ. The ISI+DCD jitter components can be separated from the PJ component based on the following observations:

1. All impulses due to ISI+DCD components must appear at multiples of 0.5/N, where N is the number of symbols in the data sequence's repeat pattern. (step 810),
2. Any remaining impulses are due to PJ. (step 825) (Refer also to FIG. 6).

From the spectrum of PJ thus isolated, an inverse FFT is performed to recover PJ in the time domain (step 835). The parameter of interest for the PJ is the peak-peak value of its time train. Once again, those locations marked "interpolated" are not counted when computing the peak-peak value (steps 845, 855, 865).

The histogram of DJ and its components can be obtained through inverse FFT on the corresponding spectrum impulses. Using only the (impulsive) portions of the jitter spectrum attributable to ISI+DCD (step 820), an inverse FFT is performed to recover ISI+DCD in the time domain (step 830). Locations that are marked as "interpolated" are set to zero (step 850). The time-domain record can now be separated into two records, where one record contains only the rising edges and the other contains only the falling edges, and a histogram performed on each of them (step 860). The DCD and ISI components can be distinguished from each other based on the following properties:

1. The difference between the mean values of these two histograms is DCD (steps 890, 898).
2. The average of the peak-peak value of these two histograms is ISI (steps 870, 880).

Figure 9:
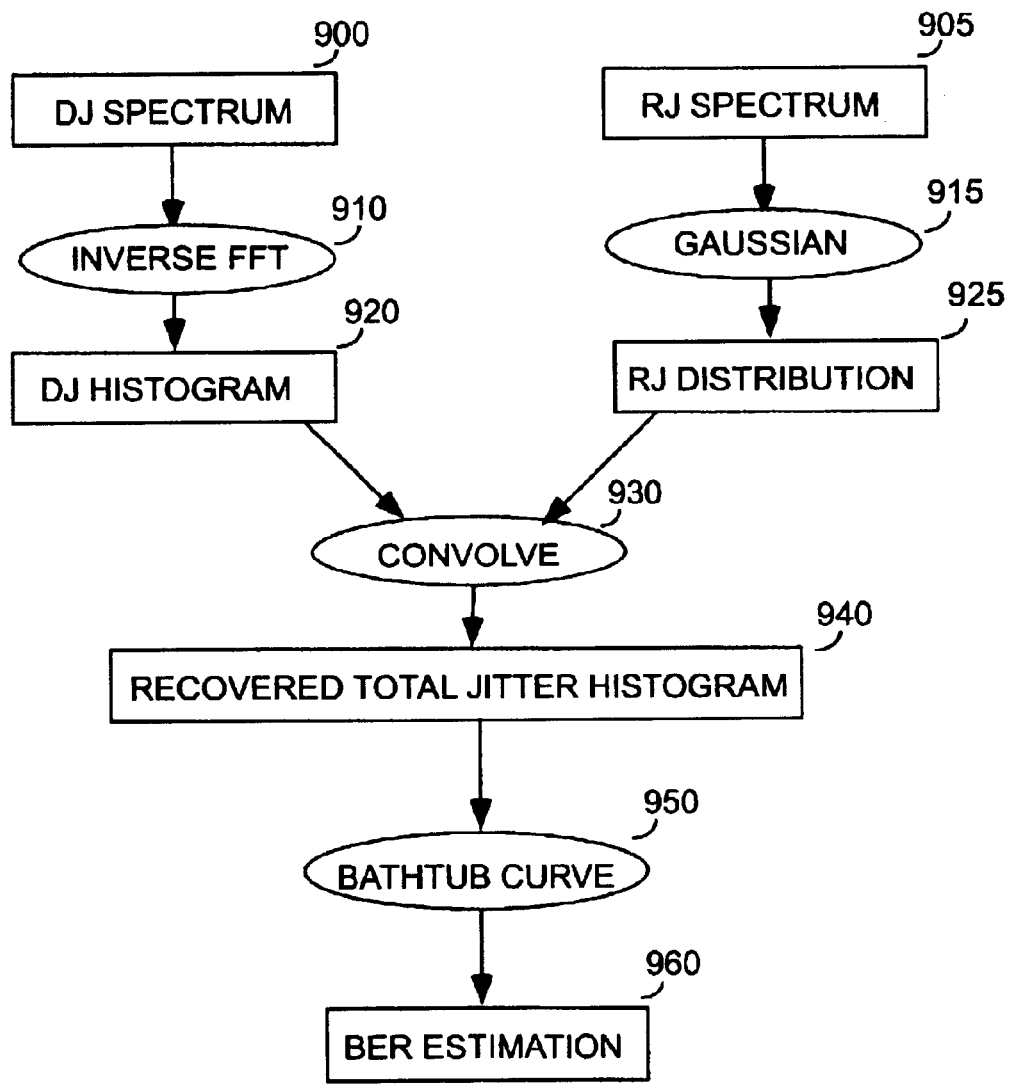
FIG. 9 is a flowchart showing the calculation of Bit Error Rate (BER) in accordance with the subject invention.
Figure 10:
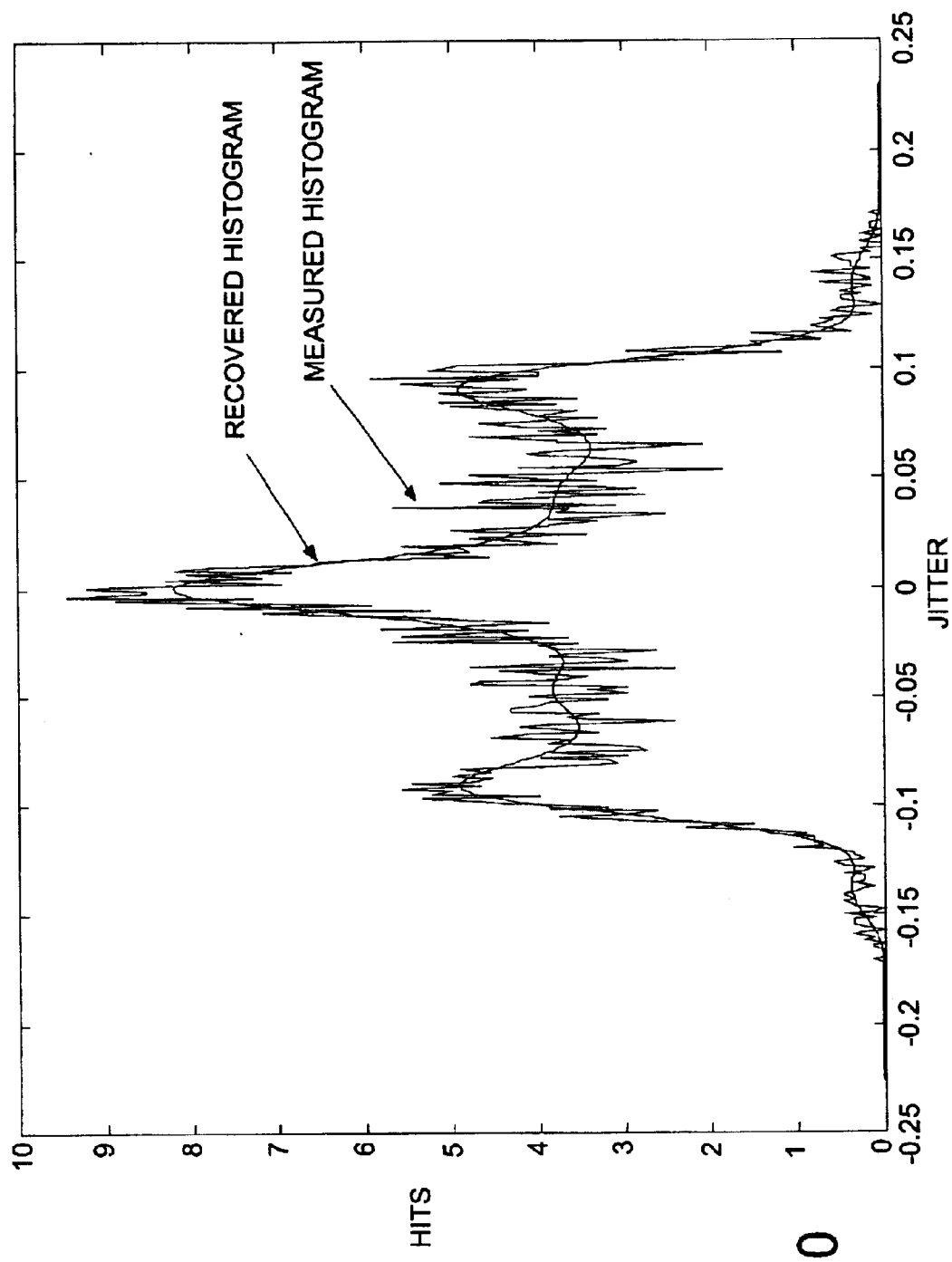
FIG. 10 is an illustration of a comparison between a normalized histogram of a set of TIE measurements and a recovered normalized histogram in accordance with the subject invention.
Figure 11:
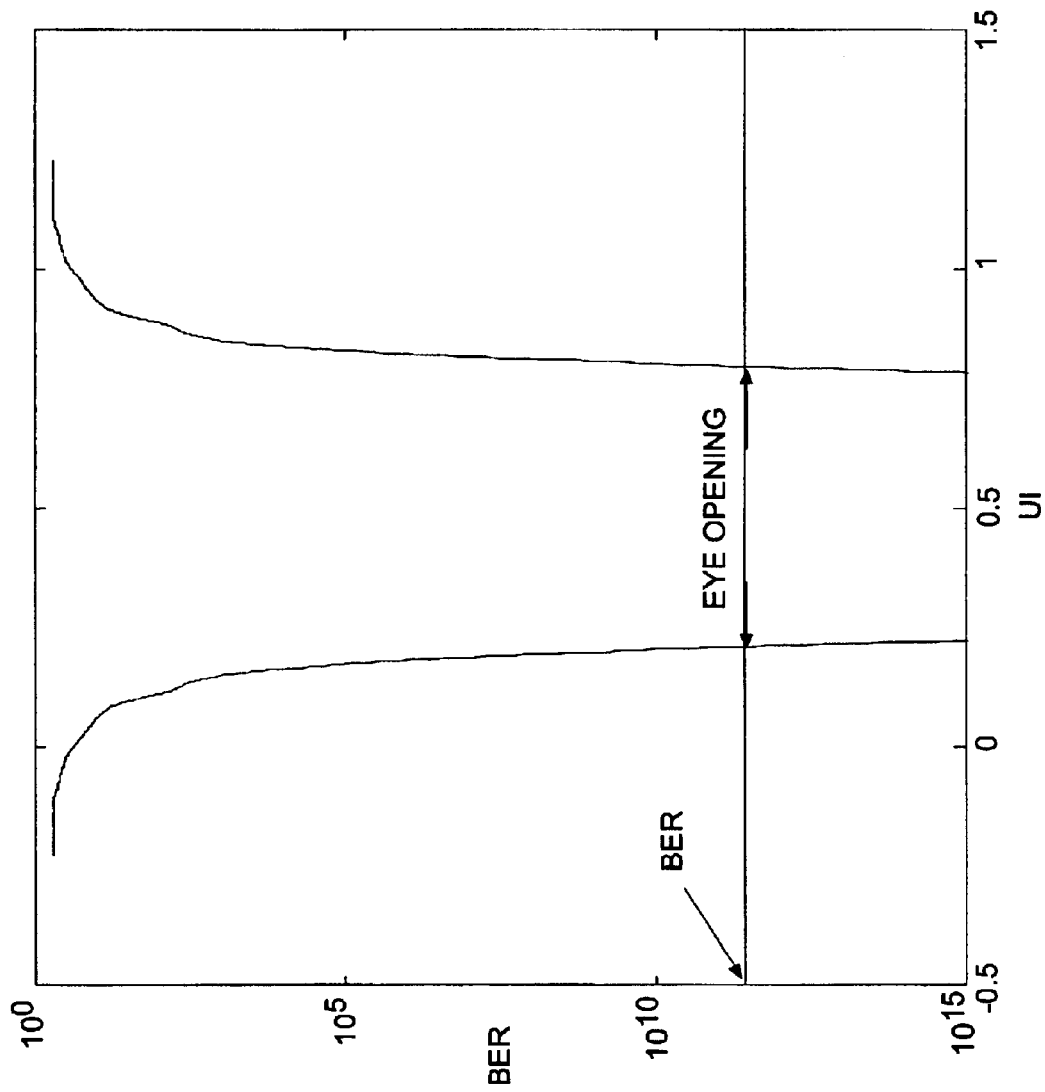
FIG. 11 is a graph of a bathtub curve useful for understanding the subject invention.

After the Deterministic Jitter and Random Jitter have been estimated according to the process shown in FIG. 9 and have been separately characterized, the Bit Error Rate (BER) can be calculated as described below:

From the DJ/RJ separation procedure of FIG. 5, the time train of DJ was obtained. The time-domain histogram of the DJ is now computed (step 910), again without counting those locations marked "interpolated". Note that this approach of recovering a J histogram is a new method. The time-domain histogram of the RJ is synthesized based on its Gaussian model (step 915), using the standard deviation obtained during the DJ/RJ separation. The histograms of DJ and RJ are then convolved (step 930), to get the recovered histogram of total jitter (step 950), as shown in FIG. 10, a graph illustrating normalized measured histogram vs. normalized recovered histogram. This recovered TJ histogram, when properly normalized, can be interpreted as the PDF of the TJ. Finally, the bathtub curve is obtained (step 960) from this PDF as previously described in FIG. 4. Based on the bathtub curve, the eye opening can be estimated for a given bit error rate (BER), as shown in FIG. 11.

What has been described is a novel methodology for decomposing Jitter (more specifically, Data Jitter) into its constituent components for measurement. More importantly, the novel methodology is useful in an oscilloscope because the initial measurement is performed in the time domain.

One skilled in the art will recognize that the subject analysis can be applied to signals other than data. That is, one can perform a subset of the RJDJ on clock signals as well. Also, the subject analysis can be applied to multi level signals, not just two levels (with a single threshold). Both of these modifications are intended to lie within the scope of the following claims.

It was mentioned above that TIE is the time difference between the "Real" data edges and the "Ideal" data edges. It should be noted that while calculation of the Ideal edges was mentioned, one skilled in the art will realize that Ideal edges do not have to be calculated. For instance, one can easily imagine a test setup where an "Ideal" data signal is applied to a Device Under Test (DUT), and both the input and the output are measured on two different channels of an oscilloscope. At this point one would have a Reference waveform (i.e., the original data signal), a Measured Data Signal, and the TIE between the two. In such a measurement arrangement, the result may be termed "Skew", rather than TIE. Other than the fact that one expects the mean (TIE)~=0 and the mean (Skew) to be other than zero, the idea is entirely equivalent, and is considered to lie within the scope of the following claims.

What is claimed is:

1. A method for decomposing Total Jitter of a data signal into its component parts of Deterministic Jitter and Random Jitter for measurement of said Deterministic Jitter and Random Jitter, comprising the steps of:

measuring Total Jitter;

performing Spectral Separation of Deterministic Jitter and Random Jitter;

performing further spectral separation of Deterministic Jitter into Periodic Jitter and its components Duty Cycle Jitter, and ISI;

performing an inverse FFT on spectrum impulses of said Deterministic Jitter and its components to obtain a histogram of said Deterministic jitter and histograms of its components;

performing further separation of Duty Cycle and ISI components using separate histograms or statistics for positive and negative edges;

measuring Peak-Peak statistics on all Deterministic Jitter components;

using Random Jitter spectral power to estimate true Random Jitter distribution;

convolving the estimated Random Jitter distribution with a Histogram of Deterministic Jitter-only data to form a histogram of said convolution; and using said histogram of said convolution to generate a bathtub error curve to estimate bit error rate.

2. A method in an oscilloscope without an arming system for measuring Deterministic Jitter (DJ) and Random Jitter (RJ) in a serial data sequence having a periodically repeating pattern and a known length, comprising the steps of:

a) measuring a time interval error (TIE) of said serial data signal;

b) employing interpolation to estimate data points at locations in said signal where no transitions occur;

c) performing a Fast Fourier Transform (FFT) using a first windowing function on said TIE to obtain a spectrum of total jitter (TJ);

d) employing a sliding window;

e) finding impulses in said spectrum of total jitter;

f) generating a frequency domain histogram on a portion of said total jitter spectrum within said sliding window;

g) estimating the amount of said RJ component from said frequency domain histogram of said total jitter spectrum; and h) calculating an amount of said DJ component from impulses in said frequency domain histogram.

3. The method of claim 2 further comprising the steps of:

moving said window to a different position in said spectrum of total litter; and repeating steps d through h until finished.

4. The method of claim 3 further comprising the step of:

k) computing a standard deviation parameter of said RJ component by computing an RMS value of said RJ component derived from said frequency domain histogram.

5. The method of claim 4 further comprising the step of:

l) separating ISI and DOD jitter components from said DJ components based upon locations of impulses due to ISI and DCD in said total jitter spectrum.

6. The method of claim 5 wherein:

said impulses due to ISI and DOD components appear at multiples of 0.5/N, where N is a number of symbols in said repeating patted of said serial data sequence.

7. The method of claim 6 further comprising the steps of:

m) removing portions of said jitter spectrum attributable to RJ, ISI, and DCD; and n) performing an inverse FFT to recover said PJ component in the time domain;

said PJ component being a peak—peak value of its time train.

8. The method of claim 7 further comprising the steps of:

o) performing an Inverse FFT to recover said ISI and DCD in a time domain record, by use of only said portions of said jitter spectrum attributable to ISI and DCD components;

p) separating said time-domain record into two records, wherein one record contains only information relating to rising edges and the other record contains only information related to failing edges;

q) performing a histogram on each of said two records;

r) computing a difference between mean values of said two histograms to obtain said DCD component; and s) computing an average of peak—peak values of said two histograms to obtain said ISI component.

9. The method of claim 7 wherein the step of calculating said DJ component comprises the steps of:

t) performing an inverse FFT on said frequency domain spectrum containing said ISI, DOD, and PJ components; and u) computing therefrom a time-domain histogram of said DJ component.

10. The method of claim 9 further comprising the steps of:

v) computing a time-domain histogram of said RJ component based upon on its Gaussian model using said standard deviation parameter and w) convolving said histograms of said DJ and RJ components to obtain a histogram of total jitter.

11. The method of claim 9 further comprising the steps of:

x) generating a bathtub curve by integrating said histogram of total jitter;

said bathtub curve being a complementary cumulative distribution function; and y) estimating an eye opening for a given bit error rate, based on said bathtub curve.

12. A method in an oscilloscope without an arming system for measuring Deterministic Jitter (DJ) and Random Jitter (RJ) in a serial data sequence having a periodically repeating pattern and a known length, comprising the steps of:

a) measuring a time interval error (TIE) of said serial data signal;

b) employing interpolation to estimate data points at locations in said signal where no transitions occur;

c) performing a Fast Fourier Transform (FFT) on said TIE to obtain a spectrum of total jitter (TJ); and d) separating spectral peaks.

13. The method of claim 12, wherein the step of separating comprises:

e) generating a frequency domain histogram on said total jitter spectrum;

f) estimating the amount of said RJ component from said frequency domain histogram of said total jitter spectrum; and g) calculating the amount of said DJ component from impulses in said frequency domain histogram.

* * * * *